USO05347175A

United States Patent [19]
Laug et al.

[11] Patent Number: 5,347,175
[45] Date of Patent: Sep. 13, 1994

[54] VOLTAGE COMPARATOR WITH REDUCED SETTLING TIME

[75] Inventors: Owen B. Laug, Barnesville; T. Michael Souders, Frederick, both of

[73] Assignee: The United States of America as represented by the Secretary of Commerce, Washington, D.C.

[21] Appl. No.: 882,392

[22] Filed: May 12, 1992

[51] Int. Cl.[5] .............................................. H03K 5/24
[52] U.S. Cl. ..................................... 307/354; 307/352; 307/455; 307/516
[58] Field of Search ................... 307/354, 272.2, 272.1, 307/350, 455, 530, 608, 352, 516

[56] References Cited

U.S. PATENT DOCUMENTS

| | | | |
|---|---|---|---|
| 4,438,349 | 3/1984 | Shoji | 307/354 |
| 4,654,584 | 3/1987 | Gyles | 364/487 |
| 4,807,147 | 2/1989 | Halbert et al. | 324/76 K |
| 4,970,406 | 11/1990 | Fitzpatrick et al. | 307/272.2 |
| 5,001,361 | 3/1991 | Tamamura et al. | 307/272.2 |
| 5,099,142 | 3/1992 | Barre | 307/272.2 |
| 5,134,312 | 7/1992 | Jones, Jr. et al. | 307/272.2 |
| 5,144,174 | 9/1992 | Murakami | 307/608 |
| 5,155,383 | 10/1992 | Barbera | 307/272.2 |

OTHER PUBLICATIONS

"An 8-bit 200-MHz BiCMOS Comparator", Peter J. Lim et al, IEEE Journal of Solid-State Circuits, vol. 25. No. 1, Feb. 1990.

"Characterization of a Sampling Voltage Tracker for Measuring East, Repetitive Signals," Souders et al, IEEE Transactions on Instrumentation and Measurement, vol. IM-36, No 4, Dec. 1987.

Primary Examiner—Timothy P. Callahan
Assistant Examiner—My. Trang Nu Ton
Attorney, Agent, or Firm—Michael M. de Angeli

[57] ABSTRACT

An improved voltage comparator for use in waveform characterization and like applications is disclosed. The current drawn through two matched transistors connected to a source of current is measured to determine whether a reference signal applied to the base of a first reference transistor is greater or less than the signal to be measured applied to the base of the other transistor. Current is only drawn through the two transistors at times corresponding to desired sampling times, substantially eliminating differential heating effects. The comparator provides substantially reduced settling times, resulting in reduced distortion of the waveform.

14 Claims, 3 Drawing Sheets

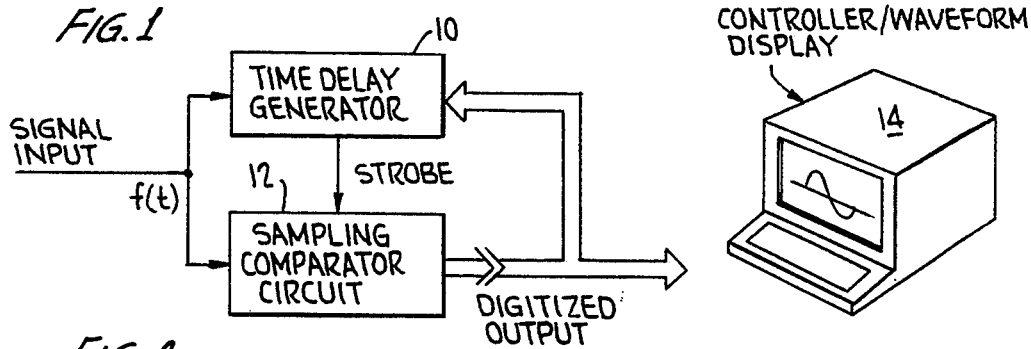
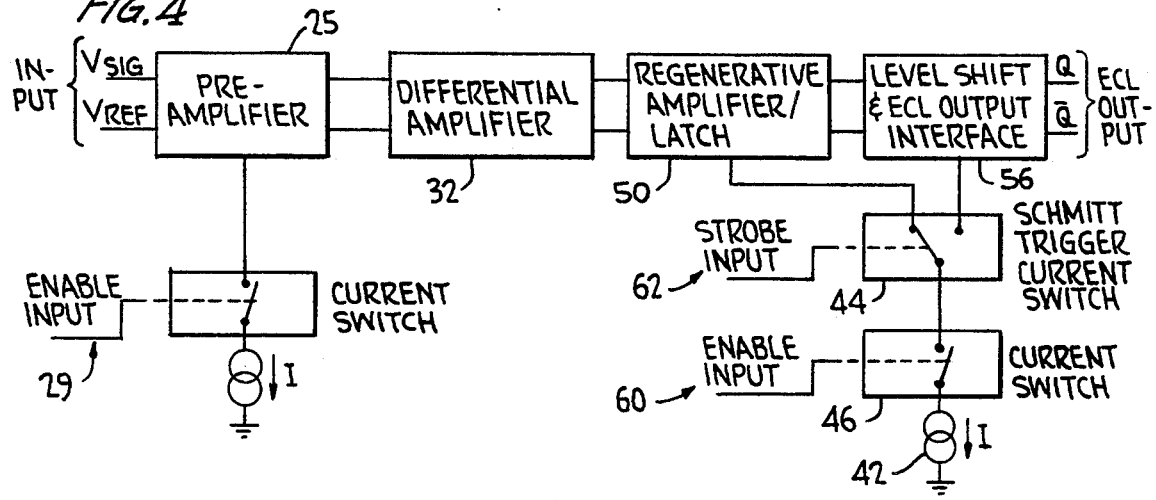
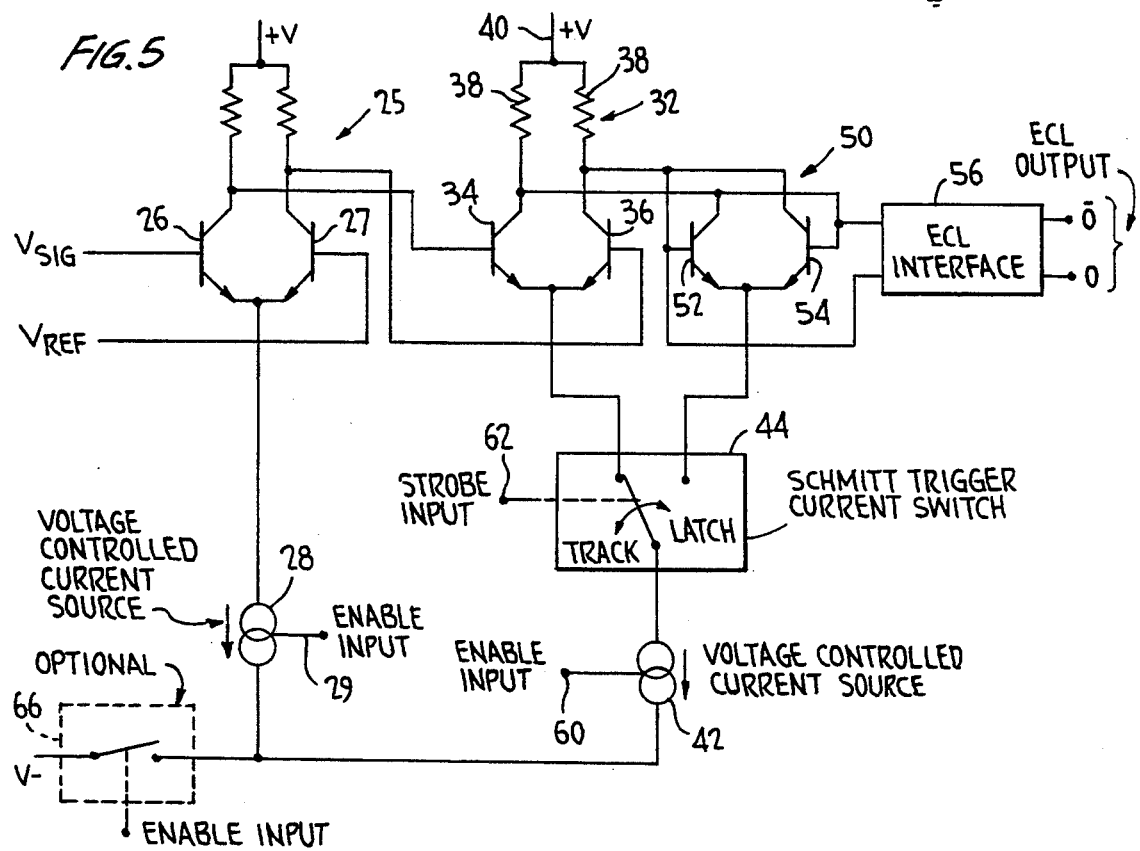

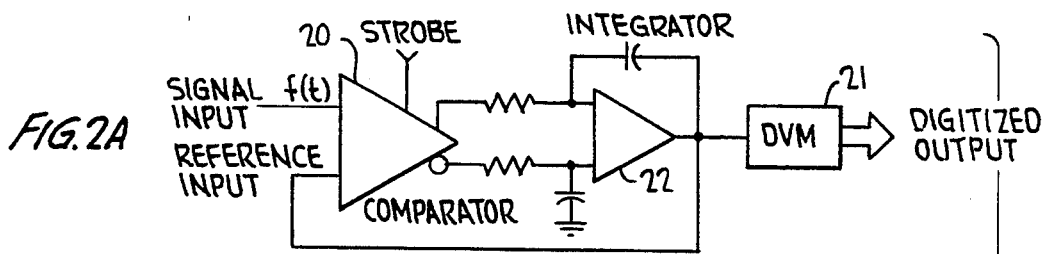
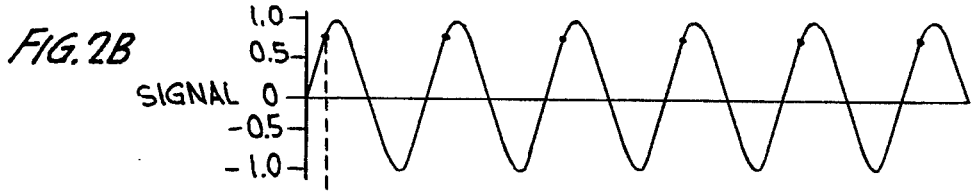
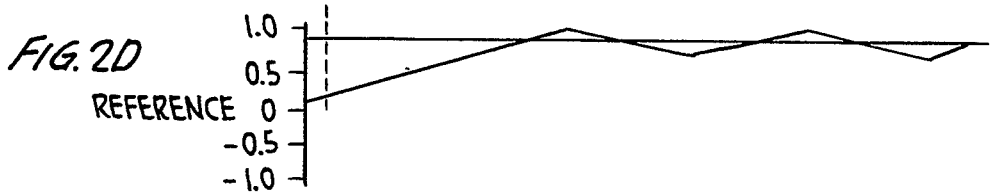
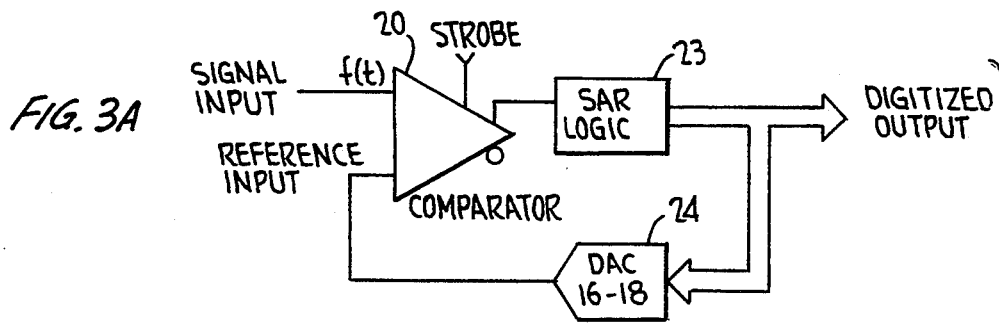
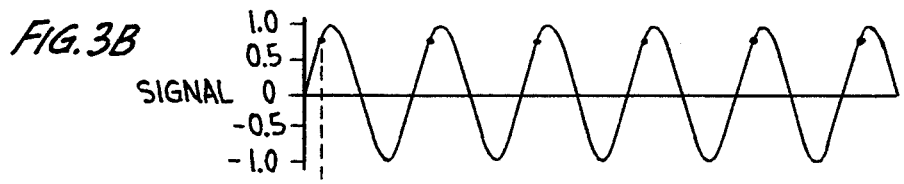
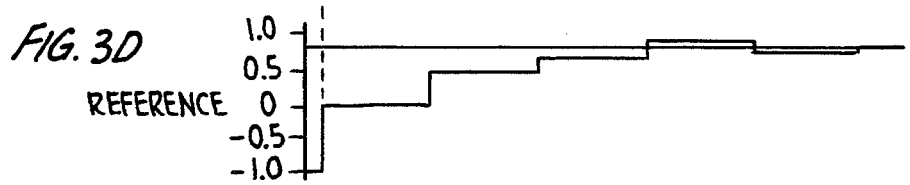

VOLTAGE COMPARATOR WITH REDUCED SETTLING TIME

BACKGROUND OF THE INVENTION

1. Field of the Invention

This invention relates to an improved voltage comparator. More particularly, this invention relates to a voltage comparator having reduced settling time errors and thus reduced distortion.

2. Background of the Invention

There are many occasions throughout electronic engineering, and particularly in instrument manufacture, where it is necessary to compare a reference voltage to a signal voltage. For example, so-called "sampling comparators", as used in many oscilloscopes, measure the varying voltage of a signal to provide a suitable display thereof. Sampling voltage tracker circuits using an "equivalent-time" sampling approach are commonly used in such instruments. See for example U.S. Pat. No. 4,654,484 to Gyles, and "An 8-bit 200 MHz BiCMOS Comparator" Lim et al, *IEEE J. of Solid-State Circuits*, 25, 1, February 1990.

A block diagram of such a sampling comparator is shown in FIG. 1, and includes a time delay generator 10, a sampling comparator circuit 12, and a controller 14 with integral waveform display capability. The input signal to be displayed f(t) is supplied to the sampling comparator circuit 12 and to the time delay generator 10. Controller 14 determines a point on the input waveform f(t) to be measured. The sampling comparator circuit 12 generates a reference voltage and compares the reference voltage with the signal f(t) at the same point on each successive "copy" of the input signal. The comparison is made responsive to a strobe signal from the time delay generator 10. The sampling comparator circuit 12 thus provides an output signal to controller 14 responsive to the level of the waveform f(t) at the sampling time defined by the strobe signal. Controller 14 then instructs the time delay generator to alter the timing of the strobe signal, so that the sampling comparator similarly samples a subsequent point on the waveform. The process is repeated until the entire waveform has been sampled. At this point the complete series of values for the sampled points on the waveform are employed by controller 14 to reconstitute and display the waveform.

More specifically, the reference voltage is compared to the signal waveform repetitively at the same point in each cycle of the input waveform, when strobe pulses are received from a time delay generator 10. Over several cycles of operation, the reference voltage will closely approximate the input waveform f(t) at that particular point on the waveform. When successive comparison indicates that the reference voltage is substantially equal to the signal f(t), or after a fixed number of cycles of operation, controller 14 stores the reference voltage, and causes the time delay generator 10 to alter the timing of the strobe pulses so that the sampling takes place at a different point on the waveform. The process is then repeated, measuring a slightly different point on the waveform. When the entire waveform has been sampled at very short intervals, an accurate representation thereof can be generated and displayed.

FIGS. 2 and 3 illustrate two different embodiments of the sampling comparison circuit component 12 of the block diagram of FIG. 1. In FIG. 2, FIG. 2a shows a block diagram of the circuit, FIG. 2b shows the voltage of the signal f(t) being measured as a function of time, FIG. 2c shows the sequence of strobe pulses and FIG. 2d shows the reference signal, which converges to equal the value of the waveform f(t) at the strobe time. In the circuit of FIG. 2a, the signal to be measured is input to a comparator 20, together with a reference voltage provided by an integrator 22. The comparison of the signal and reference voltages occurs when a strobe signal pulse (FIG. 2c) is received. The successive outputs of the comparator 20 are summed in integrator 22, becoming the reference input. As indicated, a digital voltmeter 21 can be used to provide a digitized output signal, e.g. to controller 14 (FIG. 1).

As shown in FIG. 2b, the strobe pulses of FIG. 2c control the time at which the comparison between signal input and the reference input occurs. As shown in FIG. 2d the reference signal will typically oscillate slightly about the actual value of the signal f(t) at the strobe time.

FIG. 3 illustrates a further version of a sampling comparator circuit 12 which can be used in the instrument of FIG. 1. FIG. 3a is a block diagram of the circuit itself. FIG. 3b shows the signal voltage f(t) as a function of time. The signal f(t) is sampled at intervals defined by a strobe signal shown in FIG. 3c. FIG. 3d shows the reference signal. FIG. 3e shows the individual bits of a digital word representing the value of the reference voltage. One bit of this digital word is output upon each comparison.

Referring to FIG. 3a, comparator 20 compares the input signal f(t) to a reference signal upon receiving a strobe pulse (FIG. 3c) and outputs either a "one" or a "zero" bit responsive to the comparison. A successive approximation register (SAR) 23 receives the output bits, and provides a digital word as input to a digital-to-analog converter (DAC) 24. DAC 24 increments or decrements the reference voltage applied to the reference input of the comparator 20 responsive to the word provided by SAR 23 after the previous comparison. As shown in FIG. 3d, the change in the reference voltage responsive to each bit output by the successive approximation register has half the value of the change responsive to the preceding bit. Accordingly, the most significant bit of the word is output first, the second most significant bit is output next, and so on as indicated in FIG. 3e. Thus, at the conclusion of n sampling intervals, the digitized output provided by the successive approximation register 23 is an n-bit digital word directly representative of the value of the input signal at the strobe time.

Essentially the same comparator 20 is used in the circuits of both FIGS. 2 and 3. In the prior art, such comparators include two identical transistors, typically formed on the same substrate for uniformity, and connected differentially to a source of current. The reference voltage signal is applied to the base of a first reference transistor and the input signal to be measured is applied to the base of a second signal transistor. Accordingly, the amount of current conducted through the respective transistors can be measured and compared to determine whether the reference signal is greater than the sample signal or vice versa. Typically, the currents conducted through the two transistors are latched by a second pair of transistors responsive to the strobe pulse. See the Lim et al paper referred to above.

As discussed above, in the sampling circuits of FIGS. 2 and 3, the comparison of the reference voltage to the signal voltage takes place at a single instant during each period of the signal. Conventionally, however, the signal voltage and the reference voltage are provided to the bases of the signal and reference transistors of the comparator throughout the waveform, except at the strobe time, when the power is applied to the latching transistors. See Lim et al. Accordingly, the signal and reference transistors conduct varying amounts of current corresponding to the different levels of the input signal f(t) and the reference voltage. Therefore, differing quantities of heat are dissipated by the two transistors of the comparator. Accordingly, even though as noted both transistors are commonly formed on a single substrate, as they are heated differently their base-to-emitter voltage characteristics vary somewhat inconsistently, Such differential heating effects are known to the art to cause a slight inaccuracy in the comparison and to distort the signal as finally represented by a series of words determined as above. For example, the "corners" of a square wave input signal f(t) tend to be rounded due to such differential heating effects. This distortion is referred to as a "thermal tail". U.S. Pat. No. 4,807,147 to Halbert et al, e.g., at Column 2, line 12, refers to such thermal tails. Halbert however does not provide any solution to thermal tails caused by the phenomenon just discussed. This distortion is particularly evident at input signal frequencies corresponding to the thermal time constants exhibited by the transistors of the comparator circuit.

The art suggests that such thermal tails may be compensated for in software; for example, controller 14 may be provided with software to correct the distortion induced by the thermal tails. However, such software compensation is complex and is only useful in a narrow range of frequencies.

The prior art also teaches preamplifying the input waveform f(t) and the reference signal using a second differential pair of transistors. Thermal tail phenomena are also understood to originate in such preamplifying transistors, again due to differential heating effects.

OBJECTS AND SUMMARY OF THE INVENTION

It is accordingly an object of the invention to provide a voltage comparator for comparing a reference signal to an input signal at a particular instant of time, such that thermal tails distorting the reconstructed waveform are avoided, and accordingly to provide a signal sampling circuit having reduced distortion as compared to the prior art.

This object of the invention and others which will appear as the discussion below proceeds are satisfied by the present invention wherein a comparator comprising two transistors, the base of one transistor being connected to the input signal and the base of the other transistor being connected to the reference signal, is only connected to a source of current at specific times closely corresponding to the strobe times at which the reference signal is actually compared to the input signal. In this way, differential heating of the two transistors is substantially eliminated. Where the comparator circuit incorporates preamplification, the preamplifying transistors can similarly be disconnected from the power source except at the time the measurement is to be made.

BRIEF DESCRIPTION OF THE DRAWINGS

The invention will be better understood if reference is made to the accompanying drawings, in which:

FIG. 1 as discussed above is a block diagram of a waveform reconstruction and display instrument incorporating a sampling comparator circuit according to the prior art;

FIG. 2, comprising FIGS. 2a–2d, illustrates a sampling voltage tracker element as used in the prior art, wherein FIG. 2a is a schematic diagram of the sampling voltage tracker and FIGS. 2c–2d show related waveforms as functions of time;

FIG. 3, comprising FIGS. 3a–3e, similarly illustrates a second embodiment of a sampling voltage tracker element used in the prior art, with related waveforms;

FIG. 4 is a functional block diagram of the improved comparator according to the invention;

FIG. 5 is a more detailed, partly schematic diagram of the comparator circuit according to the invention;

DESCRIPTION OF THE PREFERRED EMBODIMENTS

Figure 6:
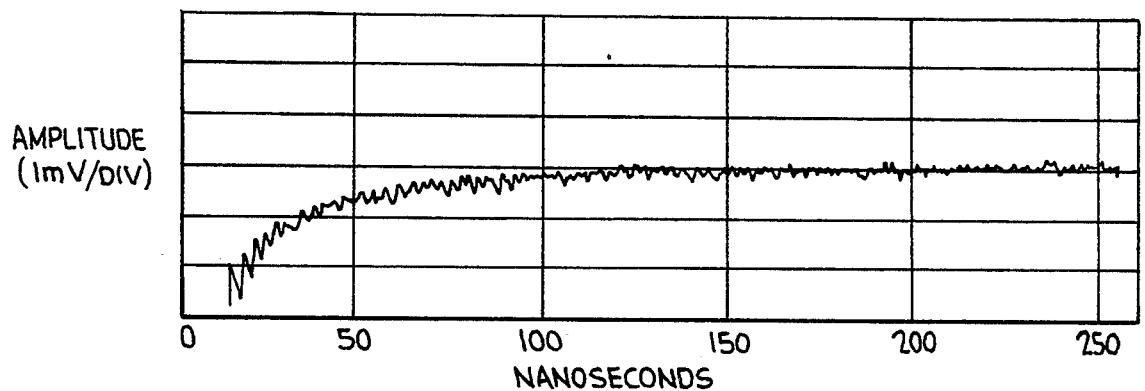
FIG. 6 is a graph of a reconstructed square-wave input signal illustrating distortion induced by thermal tail phenomena inherent in the comparator circuits according to the prior art.

As indicated above, FIG. 1 illustrates instruments in the prior art for providing accurate reconstruction and display of a cyclical input signal f(t), using one of the sampling voltage comparator circuits of FIGS. 2 or 3 to measure the waveform at successive points thereon. The present invention includes an improved comparator which may be substituted for the comparator 20 in either of the circuits of FIGS. 2a and 3a. FIG. 4 is a block diagram of a comparator according to the invention, and FIG. 5 is a more detailed, partially schematic block diagram thereof.

In the preferred embodiment, the reference signal voltage $V_{ref}$ and the signal f(t) to be measured, $V_{sig}$, are supplied to a preamplifier 25 made up of a matched pair of transistors 26 and 27, and then to a differential amplifier 32 made up of a second matched pair of transistors 34 and 36. More specifically, after pre-amplification $V_{sig}$ is supplied to the base of a first signal transistor 34, and the reference voltage $V_{ref}$ is supplied to the base of the second reference transistor 36. Transistors 34 and 36 are differentially connected through resistances 38 to a source of potential V+ indicated at 40. When the circuit through a current source 42 is completed, currents proportional to the voltages present at the bases of the transistors 34 and 36 flow therethrough. In a generalized embodiment shown in FIG. 4, current flows only when a current switch 46 is closed responsive to an enable input 60. In the preferred embodiment, shown in FIG. 5, the function of current switch 46 is performed by switching voltage controlled current source 42 to turn on responsive to enable input 60. Enable input 60 is provided just prior to strobe input 62; strobe input 62 is provided to a second current switch 44, which controls the time at which the input signal is sampled.

Figure 8:
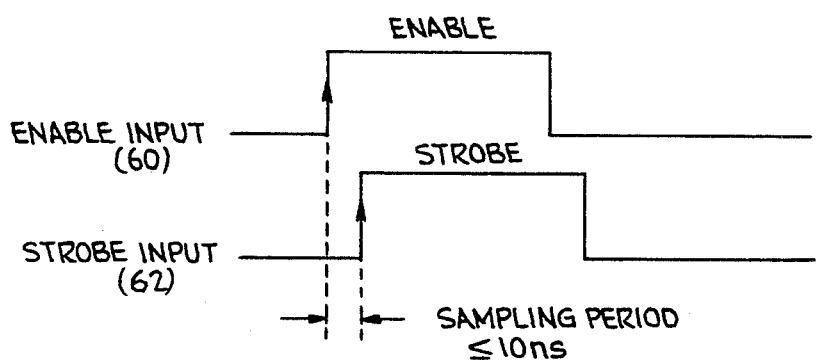
FIG. 8 is a timing diagram showing the relationship of enable and strobe signals encountered in operation of the comparator of the invention.

FIG. 8 shows the relationship of the enable input 60 and the strobe input 62; as indicated by FIG. 8, the enable input precedes the strobe input by approximately 10 nanoseconds, defining a sampling period. The sampling period is thus kept short to prevent differential heating of transistors 34 and 36, and reducing the settling time of the comparator according to the invention.

More specifically, when the strobe input 62 is received, the instantaneous potential across the collectors of transistors 34 and 36 is stored in a latching circuit 50 made up of another pair of transistors 52 and 54. The comparison signal provided thereby is provided to emitter coupled logic (ECL) interface 56 to provide suitable logic level output signals. Thus ECL interface 56 may be connected to integrator 22 in the circuit of FIG. 2 or successive approximation register 23 in the circuit of FIG. 3.

As indicated in FIG. 5, the current switch 44 is switched between a "track" position, wherein the comparison is made, and a "latch" position where the result of the comparison is latched. See Lim et al, supra. According to the invention, just prior to the time it is desired to sample the input signal, e.g. 10 ns earlier, an enable signal 60 is provided to the current source 42.

See FIG. 8, as discussed above, illustrating the relationship of the enable input and the strobe input together defining the sampling period. In this way, according to the invention, current is only drawn through the signal and reference transistors 34 and 36 respectively when it is actually desired to sample the waveform. The overall heating experienced by the transistors 34 and 36 is therefore very greatly reduced.

As noted above, it is commonly desired to provide pre-amplification of the input signal f(t) and the reference signal in preamplifier stage 25, including transistors 26 and 27. Transistors 26 and 27 likewise experience differential heating effects and contribute to the thermal tail phenomenon. Therefore, according to a further aspect of the invention, a further voltage controlled current source 28 supplying transistors 26 and 27 is controlled by a further enable signal 29 to similarly turn on only when it is desired to compare the input and reference signals, e.g. just prior to the strobe pulse 62. In most cases enable input 29 and enable input 60 may be identical.

In a further embodiment of the invention, the current source 28 and 42 may instead be deactivated by disconnecting the negative supply voltage V− from the entire circuit, as indicated by optional switch 66. In this embodiment, voltage controlled current sources 28 and 42 would be replaced by current sources operating when in circuit with an appropriate source of potential and load. However, in most implementations this would likewise disconnect V− from the remainder of the associated circuitry (e.g. the ECL interface 56), which might lead to further complications.

Figure 7:
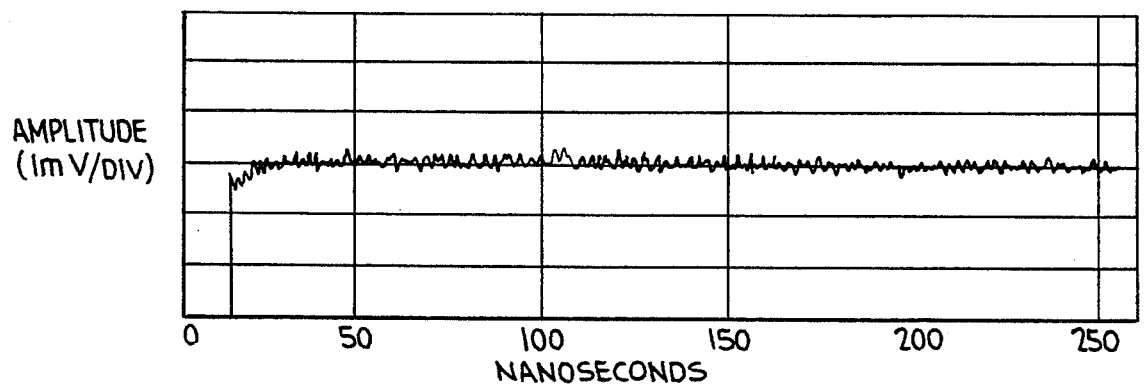
FIG. 7 is a graph comparable to FIG. 6 illustrating the substantially improved waveform reconstruction provided by use of the circuit of the invention.

FIGS. 6 and 7 show dramatically the improvement provided according to the present invention. FIG. 6 is a waveform depicting voltage as a function of time illustrating the response of the prior art comparator to an input square wave, that is, wherein the reference voltage is supplied to the reference transistor and the signal voltage is supplied to the signal transistor continually. It will be observed that the prior art circuit requires some 150 ns to settle to its final value, and that the square-wave input waveform is distorted to assume a rounded shape. FIG. 7 depicts the response of the same circuit incorporating the improvement according to the invention. Thus, in FIG. 7, current only flows through the transistors at approximately the strobe sampling time, and the output settles to its final value in less than 25 ns. Therefore it is apparent from comparison of FIGS. 6 and 7 that substantially improved results are provided according to the invention.

The improvement of the invention may be employed in a wide variety of circuits requiring accurate voltage measurements, such as digital oscilloscopes and signal waveform recorders, and may also be useful in characterization of waveform generators and like instruments. The improved response of the comparator according to the invention is particularly useful in accurately characterizing step-like or square-wave signals requiring very fast, undistorted response. The circuit of the invention also more accurately characterizes sine wave signals, particularly as to rms measurements.

Implementation of the invention is within the skill of the art. The results shown in FIG. 7 were obtained upon test of a prototypical version of an application-specific integrated circuit (ASIC) fabricated to the inventors' design. The ASIC was disposed in a signal probe and was connected as closely as possible to the input signal lead. The enable input signal 60 was obtained by a simple modification of the time delay generator 10 (FIG. 1). Useful results were also demonstrated by disconnecting V− from the current sources, as indicated by optional switch 66 (FIG. 5).

As indicated in FIGS. 4 and 5, the switch 44 responsive to the strobe input 62 that controls whether current flows through the differential amplifier 38 or the latch 50 is preferably configured as a Schmitt trigger, to provide the fastest possible switching speed. Switch 46, connecting the current source 42 to the differential amplifier 32 responsive to the enable input 60, could also be a Schmitt trigger, but need not be, as the performance requirements are relatively low. In one successfully tested implementation of the invention, current source 42 was provided by a transistor connected between a circuit reference point V− and the Schmitt trigger current switch 44, and having enable input signal 60 applied to its base. As noted, V− could equivalently be disconnected from the circuit except during the desired measurement interval.

It will be appreciated that differential heating of the reference and signal transistors could also be eliminated by disconnecting the $V_{ref}$ and $V_{sig}$ input signals from the bases of the transistors. Disconnecting the bases of the corresponding transistors for different purposes is discussed by Lim et al, supra, at p. 196. As acknowledged by Lim et al, this would involve substantial potential for erroneous measurements due to transient noise, impedance effects and the like. Accordingly, solution of the thermal tail problem according to the invention as described above is preferred.

More particularly, the enabling technique of the invention not only reduces thermal errors but can reduce any "low frequency" aberration (thermal or electrical) in the transfer function of the comparator. The presence of undesirable electrical time constants (a linear systems phenomenon) within prior art comparators also can add tails to the settling performance. In either case, the problem is that the comparator's response time is too long. The enabling procedure of the invention for eliminating "thermal tails" also applies to these impulse response tails. In effect, the time difference, $t_d$, between the activation of the current source and the leading edge of the strobe pulse defines the effective response time of the comparator. Any tails in the impulse response of the comparator that extend beyond this duration will effectively be truncated. In the frequency domain, the frequency response of the comparator will be the Fourier transform of the truncated impulse response. The truncation will be manifested as a tendency to flatten the frequency response or transfer function for frequencies less than $1/t_d$.

Inasmuch as the present invention is subject to many variations, modifications and changes in detail, it is intended that all subject matter discussed above or shown in the accompanying drawings be interpreted as illustrative only and not be taken in a limiting sense.

What is claimed is:

1. In a voltage comparator circuit comprising a pair of transistors, each having an emitter, a base and a collector, each of said transistors being connected to conduct current along an emitter-collector current path from a first current source to a reference point, the base of a first reference transistor of said pair being connected to means for supplying a reference voltage level, and the base of a second signal transistor of said pair being connected to means for supplying a signal the voltage level of which is to be measured, and means for comparing the currents conducted through the first and second transistors to compare the reference voltage level to the signal voltage level, the improvement comprising:

switching means in the emitter-collector current path of each of said pair of transistors, for selectively controlling the flow of current from said source of current through said first and second transistors; and timing means for controlling said switching means in order that current flows through said first and second transistors only at particular times when it is desired to compare the reference voltage level to the signal voltage level.

2. The improvement of claim 1, wherein said voltage comparator circuit is part of an instrument for measuring the voltage level of a repetitive signal at regular intervals of time, wherein said reference voltage level is compared to said signal voltage level at sampling times spaced by said intervals of time, and said timing means controls said switching means such that current flows through said transistors only at times corresponding to said sampling times.

3. The improvement of claim 1, wherein said reference signal level is supplied from an integrator connected to receive and sum voltages responsive to the output of said means for comparing.

4. The improvement of claim 1, wherein said reference signal is supplied from a digital-to-analog converter receiving a digital word input representative of said sample voltage level from a successive approximation register.

5. The improvement of claim 4, wherein the value of each bit of said digital word is set responsive to prior comparison of said reference signal voltage level to said sampled signal voltage level.

6. The improvement of claim 1, wherein said switching means controls activation of said first source of current.

7. The improvement of claim 1, wherein said voltage comparator circuit further comprises a preamplifier for preamplifying said input signal and said reference voltage level prior to supply to said signal and reference transistors and a second current source for powering said preamplifier, and said improvement further comprises switching means such that current flows from said second current source through said preamplifier only at said particular times.

8. A voltage comparator circuit comprising:

a first source of current;

a pair of transistors, each comprising an emitter, a base, and a collector, said transistors each being connected to conduct current along an emitter-collector current path from said first source to a reference point, the amount of current conducted by each of said transistors varying with voltage applied to the respective bases thereof, the base of a first reference transistor being connected to a reference voltage level and the base of a second signal transistor being connected to a signal the voltage level of which is to be measured;

means for comparing the currents conducted through the first and second transistors to compare the reference voltage level to the signal voltage level, and for providing an output signal responsive to said comparison;

switching means in the emitter-collector current path of each of said first and second transistors for controllably connecting said source of current to said first and second transistors; and timing means for controlling said switching means to effectively connect said first source of current to said first and second transistors only at particular times when it is desired to compare the reference voltage level to the signal voltage level.

9. The voltage comparator circuit of claim 8, in combination with means for recording values of the voltage of a repetitive signal measured at regular intervals of time, said measured values being responsive to said output signal, wherein said reference voltage level is compared to said signal voltage level at sampling times spaced by said intervals of time, and said timing means controls said switching means to connect said source of current to said transistors at times corresponding to said sampling times.

10. The voltage comparator circuit of claim 8, further comprising an integrator for supplying said reference signal, said integrator being connected to receive and sum voltages responsive to the output of said means for comparing.

11. The voltage comparator circuit of claim 8, further comprising a successive approximation register and a digital-to-analog converter, said digital-to-analog converter receiving a digital word input representative of said sample voltage level from said successive approximation register, and supplying said reference signal to said first reference transistor.

12. The voltage comparator circuit of claim 11, wherein the value of each bit of said digital word is set responsive to the comparison of said reference signal voltage level to said sampled signal voltage level.

13. The voltage comparator circuit of claim 8, wherein said switching means controls activation of said source of current.

14. The voltage comparator circuit of claim 8, further comprising a preamplifier for preamplifying said input signal and said reference voltage level prior to supply to said signal and reference transistors, a second current source for powering said preamplifier, and switching means for controlling flow of current from said second current source through said preamplifier only at said particular times.

* * * * *